United States Patent [19]

Bhushan

[11] Patent Number: 5,391,518
[45] Date of Patent: Feb. 21, 1995

[54] METHOD OF MAKING A FIELD PROGRAMMABLE READ ONLY MEMORY (ROM) CELL USING AN AMORPHOUS SILICON FUSE WITH BURIED CONTACT POLYSILICON AND METAL ELECTRODES

[75] Inventor: Bharat Bhushan, Santa Clara, Calif.

[73] Assignee: VLSI Technology, Inc., San Jose, Calif.

[21] Appl. No.: 126,624

[22] Filed: Sep. 24, 1993

[51] Int. Cl.$^6$ .................................... H01L 21/441
[52] U.S. Cl. ............................ 437/190; 437/922; 148/DIG. 1
[58] Field of Search ............... 437/51, 101, 190, 192, 437/193, 922; 148/DIG. 1, DIG. 55; 257/529, 530

[56] References Cited

U.S. PATENT DOCUMENTS

| | | | |
|---|---|---|---|
| 4,569,121 | 2/1986 | Lim et al. | 148/DIG. 55 |
| 5,070,384 | 12/1991 | McCollum et al. | 437/193 |
| 5,106,773 | 4/1992 | Chen et al. | 437/922 |

OTHER PUBLICATIONS

"Very High Speed FPGAs 1992 Data Book", from QuickLogic Corporation, pp. 1-1 through 2-4.

*Primary Examiner*—Tom Thomas
*Assistant Examiner*—Chandra Chaudhari
*Attorney, Agent, or Firm*—Douglas L. Weller

[57] ABSTRACT

To fabricate a programmable read only memory cell an implant region is formed within a substrate. A first conductive layer is formed over the substrate. For example, the first conductive layer is polysilicon. The first conductive layer is etched to form a first electrode on the substrate in physical and electrical contact with the implant region and to form a gate region for a transistor. Atoms of a first conductivity type are implanted into the substrate into a first source/drain region on a first side of the gate region and into a second source/drain region on a second side of the gate region. The second source/drain region is electrically coupled to the implant region. An insulating layer is formed over the first electrode. The insulating layer has a link contact which extends to the first electrode region. The insulating layer also has a contact hole extending to the first source drain region. An amorphous silicon layer is formed within the link contact and in contact with the first electrode. A metal layer is deposited. The metal layer is etched to form a second electrode in contact with the amorphous silicon layer and electrically separated from the first electrode by the amorphous silicon layer, and to form a metal contact to the first source/drain region through the contact hole.

10 Claims, 7 Drawing Sheets

METHOD OF MAKING A FIELD PROGRAMMABLE READ ONLY MEMORY (ROM) CELL USING AN AMORPHOUS SILICON FUSE WITH BURIED CONTACT POLYSILICON AND METAL ELECTRODES

BACKGROUND

This invention relates generally to integrated circuits and more particularly to memory cells for programmable read-only memories (PROMs) and the like.

Field programmable gate arrays include a large number of logic elements, such as AND gates and OR gates, which can be selectively coupled together by means of fuses or anti-fuses to perform user designed functions. An unprogrammed fuse-type gate array is programmed by selectively blowing fuses within the device, while an unprogrammed anti-fuse type gate array is programmed by causing selected anti-fuses to become conductive.

There are many types of PROMs including standard, write-once PROMs, erasable programmable read-only memories (EPROMS), electrically erasable programmable read-only memories (EEPROMS) etc. A PROM usually comprises an array of memory cells arranged in rows and columns which can be programmed to store user data. PROMs are typically fuse-type devices.

Fuses for field programmable gate arrays, PROMs and the like are typically made from a titanium-tungsten (TiW) alloy and are shaped somewhat like a bow-tie having a narrow, central neck and wide ends. The neck of the fuse is typically about 2 microns wide, while the ends of the fuse are typically about 6 microns wide. When a sufficiently high voltage (usually on the order of 10 volts D.C.) is applied to the fuse, the current flowing through the fuse will cause it to heat-up and will eventually melt the fuse at its neck, thereby "blowing" the fuse.

Anti-fuses include a material which initially has a high resistance but which can be converted into a low resistance material by the application of a programming voltage. For example, amorphous silicon, which has an intrinsic resistivity of approximately 1 megohms-cm, can be fashioned into 1 micron wide link vias having a resistance of approximately 1-2 gigohms. These link vias can then be melted and re-crystallized by the application of a programming voltage in the range of 10-12 volts D.C. to form link vias having a resistance less than 200 ohms. These low resistance vias can couple together logic elements of a field programmable gate array so that the gate array will perform user-desired functions, or can serve as memory cells of a PROM. Herein, the term "fuses" is used generically to refer both to fuses (a material which initially has a low resistance but which can be converted into a high resistance material by the application of a programming voltage) and to anti-fuses (material which initially has a high resistance but which can be converted into a low resistance material by the application of a programming voltage).

Anti-fuse structures have the very desirable feature of being small in size. For example, a TiW fuse with a 2 micron neck and 6 micron end widths permits approximately 4,000 fuses to be provided on a typical device. In contrast, a 1 or 1.2 micron diameter anti-fuse via permits 80,000–100,000 fuses to be provided on a single device. Therefore, anti-fuses have the potentiality of providing vastly greater numbers of interconnections or of storing much greater amounts of information than devices using fuse technology. However, fuses in electronic devices are much more prevalent today than anti-fuses because they are easier to manufacture and have a better record of reliability. Improved manufacturing techniques have overcome several problems which formerly limited the use of anti-fuse structures.

However, in the prior art, the anti-fuse was typically built between metal one and metal two layers. This requires several additional masking steps and etch steps. For example, an extra metal layer of Titanium Tungsten, a link via, link oxide and link spacer are all required. Additional layers increase the topology and leads to metal step coverage problems. Also, defect density is increased as rigorous cleansing is not possible after metal deposition. In addition, in prior art methods, programming voltage varies a lot due to the non-conformal nature of amorphous silicon film deposited by plasma enhanced chemical vapor deposition (PECVD) techniques. See, for example, "Very High Speed FPGAs 1992 Data Book", from QuickLogic Corporation, pp. 1-1 through 2-4.

SUMMARY OF THE INVENTION

In accordance with the preferred embodiment of the present invention, a programmable read only memory cell is presented. Within a substrate, an implant region is formed. A first conductive layer is formed over the substrate. For example, the first conductive layer is polysilicon. The first conductive layer is etched to form a first electrode region on the substrate in physical and electrical contact with the implant region and to form a gate region for a transistor.

Atoms of a first conductivity type are implanted into the substrate into a first source/drain region on a first side of the gate region and into a second source/drain region on a second side of the gate region. The second source/drain region is electrically coupled to the implant region. An insulating region is formed over the first electrode region. The insulating region has a link contact which extends to the first electrode region. The insulating region also has a contact hole extending to the first source drain region. An amorphous silicon region is formed within the link contact and in contact with the first electrode region. For example, the amorphous region is formed using a low pressure chemical vapor deposition (LPCVD) and etch process. A metal layer is deposited. The metal layer is etched to form a second electrode region in contact with the amorphous silicon region and electrically separated from the first electrode region by the amorphous silicon region, and to form a metal contact to the first source/drain region through the contact hole.

The present invention allows construction of a field programmable read only memory with several significant advantages over the prior art. For example, in the present invention the amorphous silicon fuse is sandwiched between a polysilicon (or metal silicide) electrode and a metal one contact. The polysilicon electrode is connected to the drain of a transistor through a buried contact. The use of an LPCVD process to deposit the amorphous silicon is a significant advantage over the prior art where PECVD is typically used to deposit the amorphous silicon. Using a LPCVD amorphous silicon film instead of a PECVD film eliminates the need of link spaces. Also, in the present invention, the prior requirement of additional layers for a second metal electrode, link oxide and link via is eliminated. In addition, in the present invention, highly oxidizing cleaning agents can be used after photolithography steps up to deposition of the amorphous silicon layer. This ensures high integrity of the amorphous silicon fuse in the unprogrammed state. The resulting cell is easily scalable and allows for the fabrication of very high density ROMs.

DESCRIPTION OF THE PREFERRED EMBODIMENT

Figure 1:
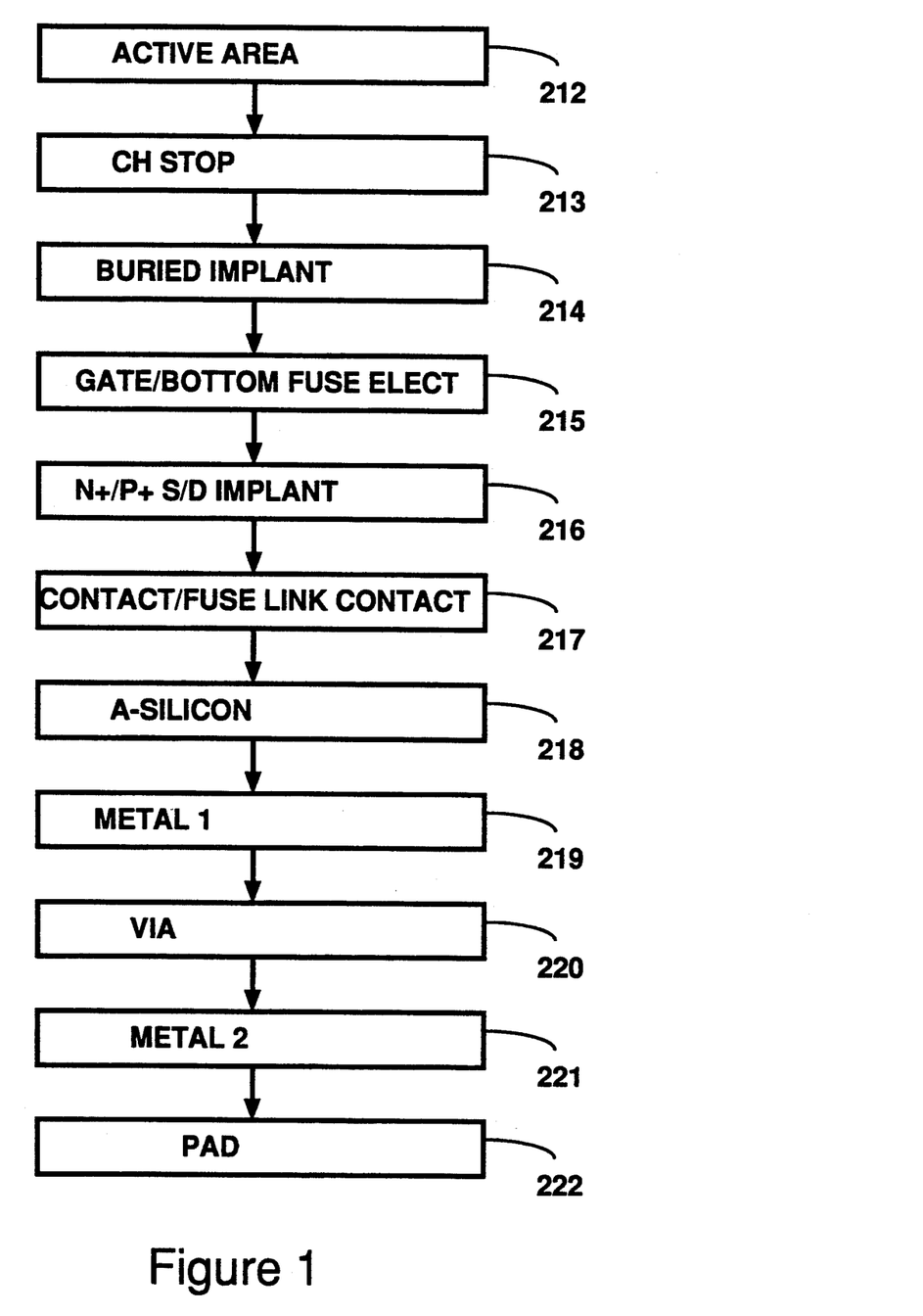
FIG. 1 shows method steps for constructing a field programmable read only memory (PROM) using an amorphous silicon fuse with a buried polysilicon electrode and a metal electrode in accordance with the preferred embodiment of the present invention.
Figure 2:
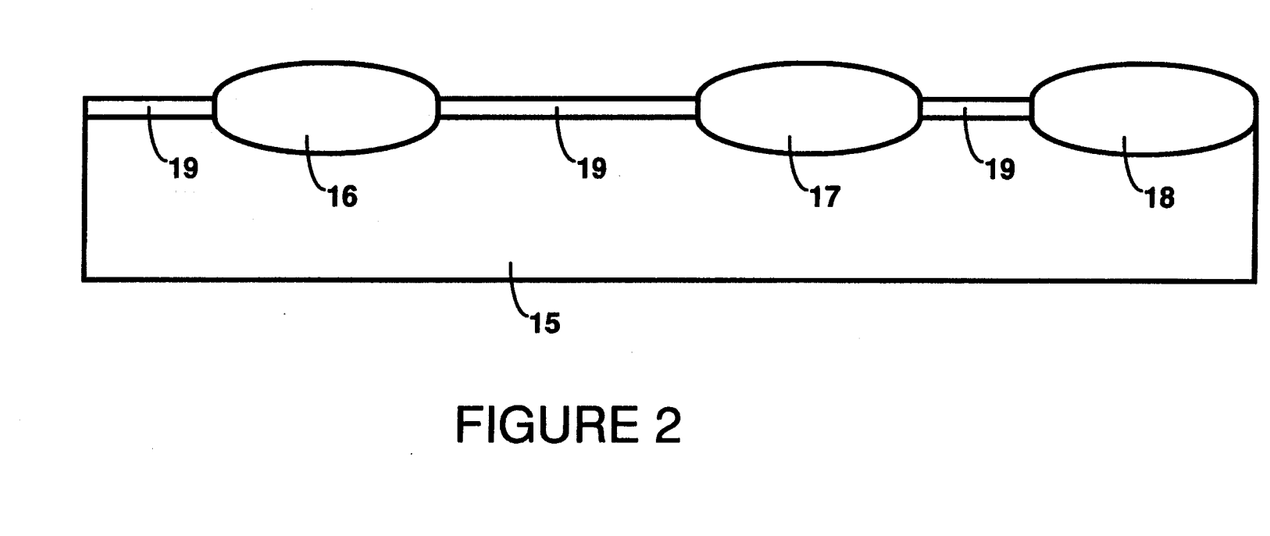
FIGS. 2, 3, 4, 5 and 6 show intermediate structures for a PROM constructed using the method described in FIG. 1 in accordance with the preferred embodiment of the present invention.

FIG. 1 shows method steps for constructing a field programmable read only memory (PROM) using an amorphous silicon anti-fuse with a buried polysilicon electrode and a metal electrode in accordance with the preferred embodiment of the present invention.

In a step 212, a local oxidation of silicon (LOCOS) process or other process is used to form field oxide regions over a substrate 15. For example, in a LOCOS process, a layer of pad oxide is deposited. On top of the pad oxide, a layer of nitride is deposited. The nitride is patterned and etched.

In a step 213, a channel stop implant is performed. For example, an implant of Boron atoms is made at a concentration of $7 \times 10^{12}$ per square centimeter on regions where nitride has been etched. The channel stop implant is used for avoiding inversion in the field oxide regions.

Field oxide is grown on the substrate at places where the nitride has been etched to expose the substrate. The nitride and pad oxide are then removed leaving a field oxide region 16, a field oxide region 17 and a field oxide region 18. After the insulating layer is formed, a layer of gate oxide 19 is placed (i.e. grown or deposited) on exposed portions of the substrate.

Figure 3:
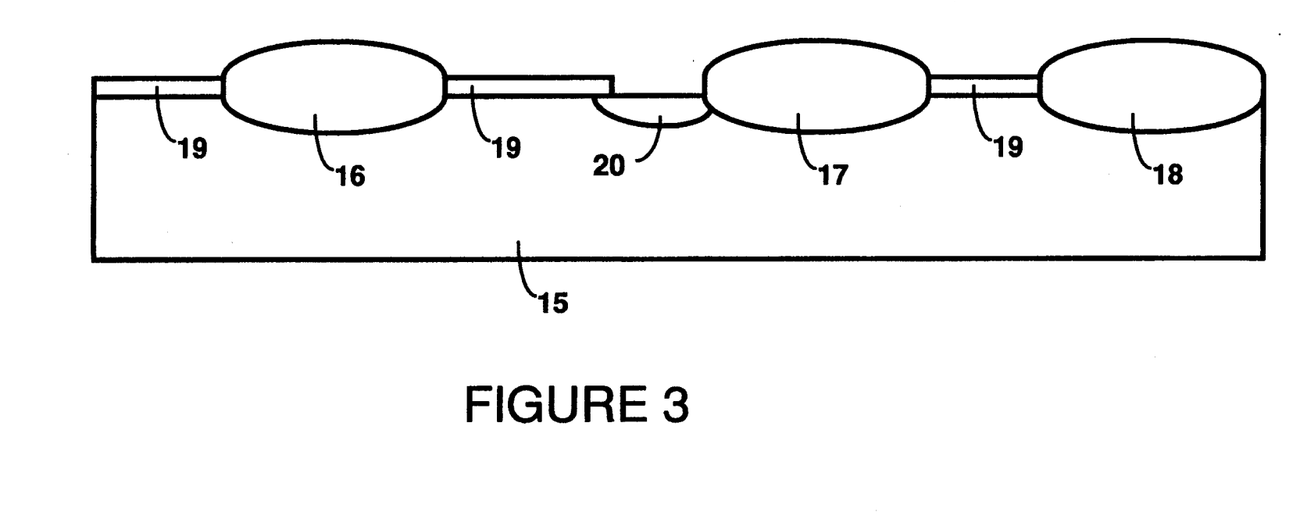
Figure 4:
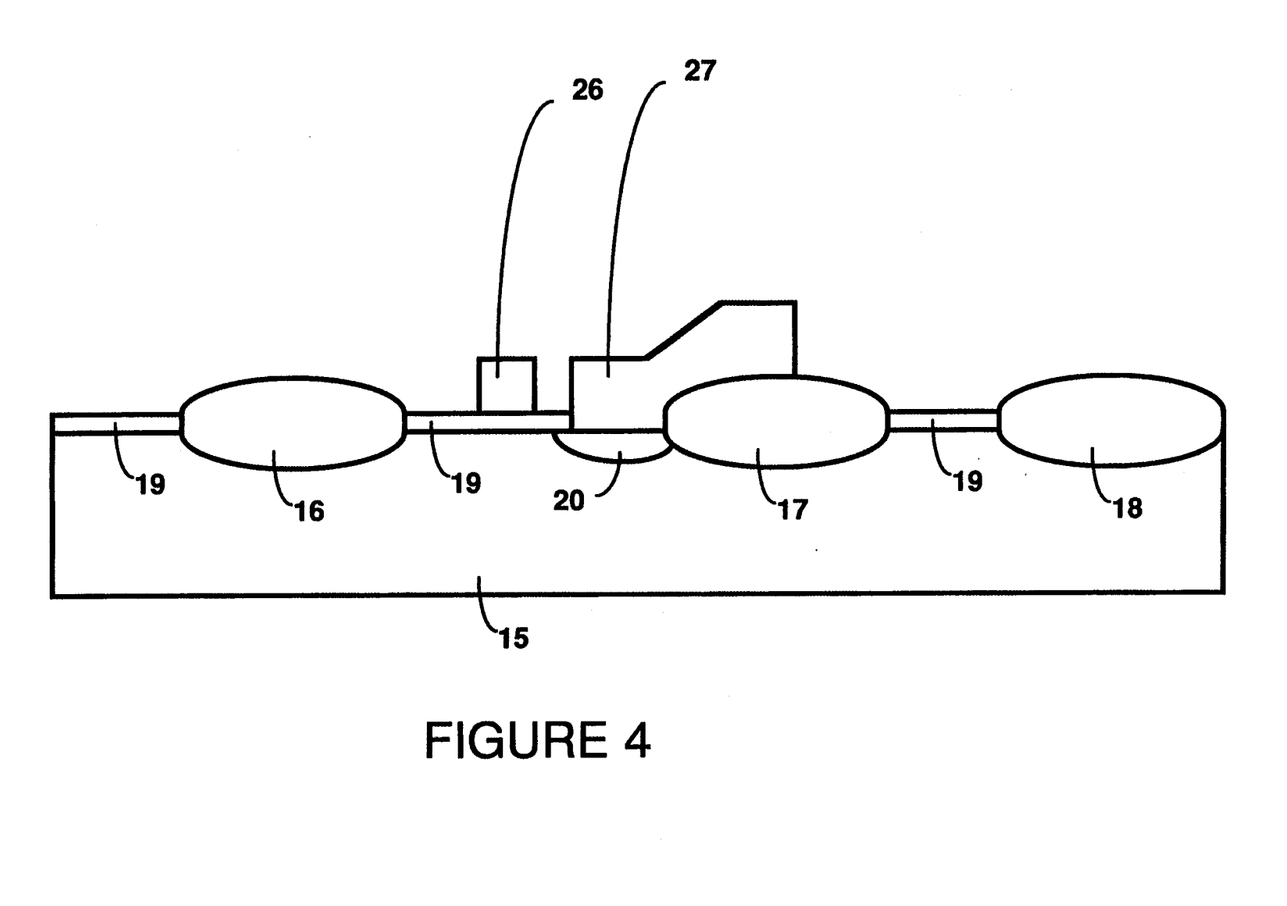
Figure 5:
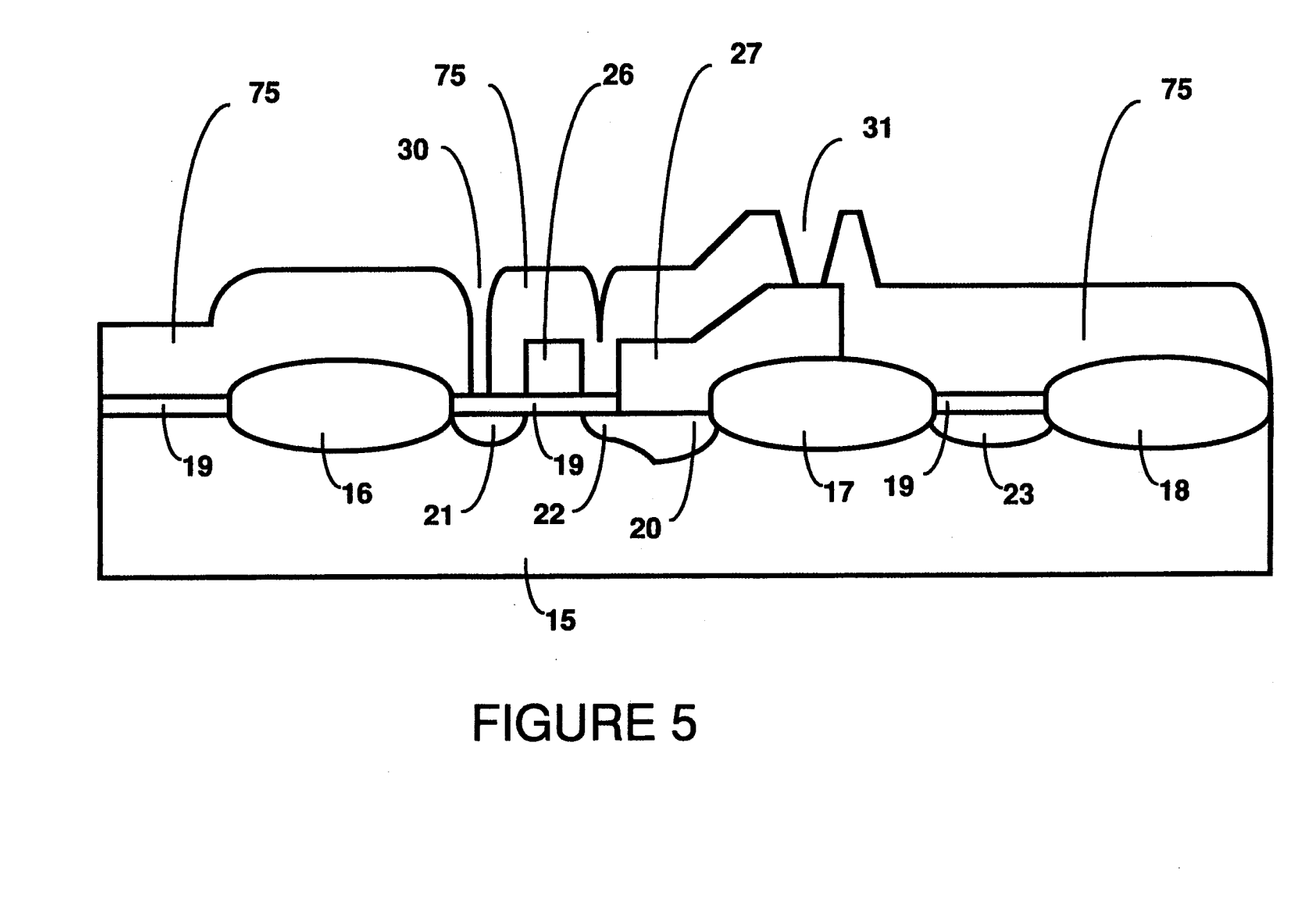

In a step 214, a buried implant region 20 is formed, as shown in FIG. 3. For example, buried implant region 20 is an n+ region doped with Phosphorus at $10^{16}$ atoms per square centimeter. Buried implant region 20 extends approximately 0.5 microns below the surface of the substrate. After the implant, the gate oxide is etched.

In a step 215, on top of the layer of gate oxide 19 and the field oxide regions, a layer of polysilicon is formed, for example, by chemical vapor deposition (CVD). The polysilicon is doped, for example, with n-type atoms (e.g., POCl$_3$) at $10^{20}$ atoms per cubic centimeter. Alternately, an implant of Phosphorus or Arsenic atoms may be used A transistor gate 26 and a bottom fuse electrode 27 are formed from the layer of polysilicon using a mask and etch process. Bottom fuse electrode 27 is connected to buried implant region 20 and extends over field oxide region 17. Alternately, transistor gate 26 and 27 can be formed with a polycide/silicide material.

Figure 6:
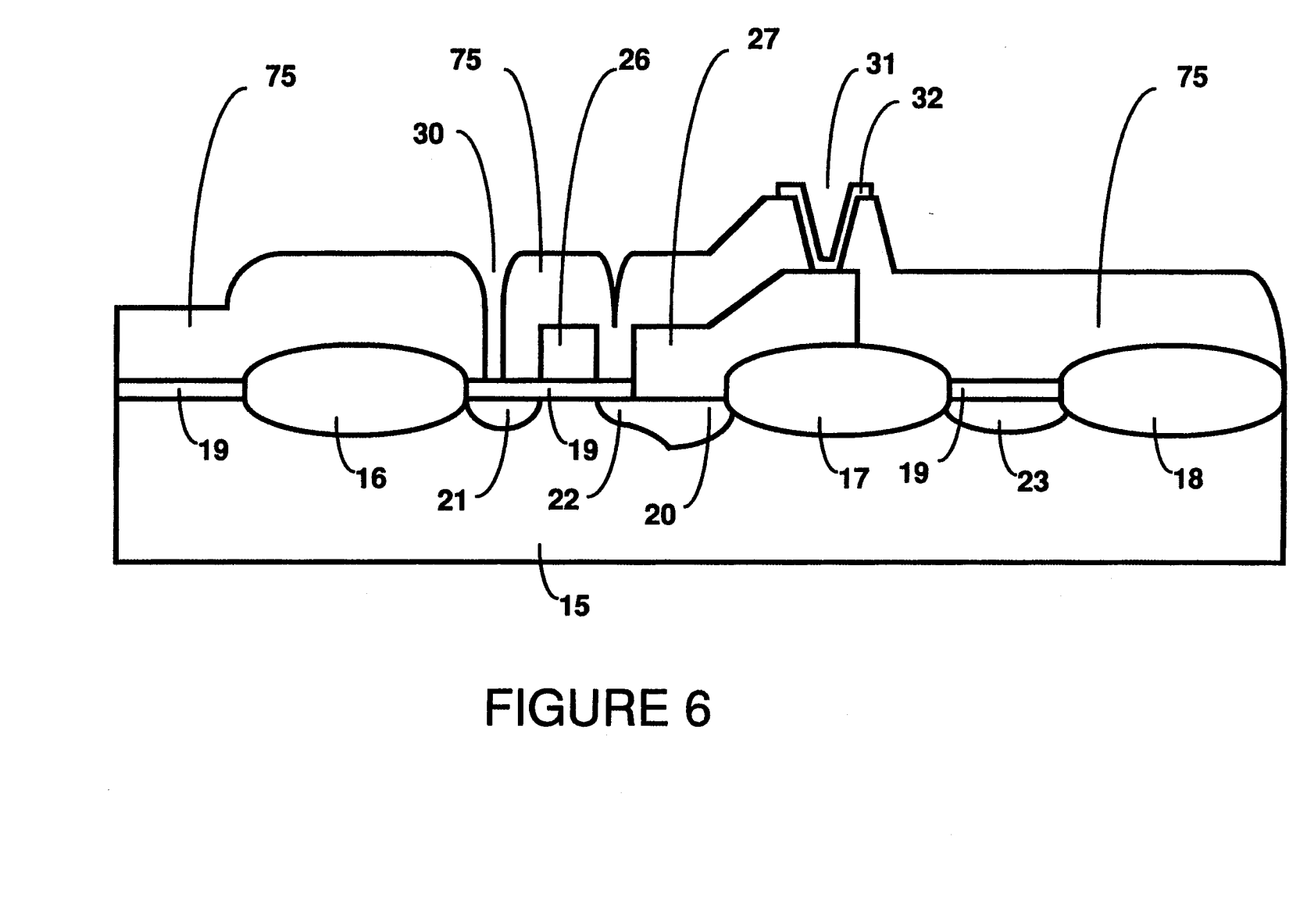

In a step 216, on the sides of transistor gate 26 are implanted a region 21 and a region 22 of second conductivity type, as shown in FIG. 6. In addition, a region 23 is implanted with p+ atoms at a concentration of, for example $10^{15}$ per square centimeter. Region 21 and region 22 act as source/drain regions for a transistor. For example, region 21, region 22 and region 23 are n+ regions doped with Arsenic at $10^{16}$ atoms per square centimeter. As shown, region 22 joins together with buried implant region 20. Region 21 and region 23 extend approximately 0.35 micrometers below the surface of the substrate. Region 21 is separated from region 22 by, for example, 1.0 microns or less.

While transistor gate 26 and bottom fuse electrode 27 are described as being formed of polysilicon, alternately, both may be made of a combination of polysilicon and metal-silicide, as will be clearly understood by those skilled in the art. For example, a thin layer of polysilicon may be deposited over the whole wafer. After doping this layer with phosphorous, a layer of metal silicide is sputtered on top of the polysilicon to form a polycide electrode. The polycide gives lower resistivity which is useful for high performance applications. For example, the metal-silicide may be Tungsten-silicide. The metal used for the metal-silicide layer may alternately consist of, for example, Molybdenum (Mo), Chromium (Cr), Nickel (Ni), Platinum (Pt), Cobalt (Co), or Tantalum (Ta).

As further shown in FIG. 6, an insulating layer 75 of, for example, Boron Phosphorus silicate glass (BPSG), is placed over the substrate. Insulating layer 75 is approximately 0.8 microns thick. In a step 217, insulating layer 75 is masked and etched to form contact hole 30 and a link contact 31. Contact hole 30 provides for contact to diffusion region 21 and link contact region 31 provides for contact to bottom fuse electrode 27.

In a step 218, a layer of anti-fuse material is deposited over the structure and within contact hole 30 and a link contact 31. The deposition process is substantially conformal so that the anti-fuse material generally assumes the contours of link contact 31. The preferred anti-fuse material is amorphous silicon which is deposited at relatively low temperatures within a low pressure chemical vapor deposition (LPCVD). For example, the LPCVD is performed at 550 degrees centigrade in silane gas (SiH$_4$) which is decomposed to form amorphous silicon. The use of an LPCVD process is possible as there is no metal present on wafers prior to step 218. This is a significant advantage over the prior art where PECVD is typically used to deposit the amorphous silicon. Using a LPCVD amorphous silicon film instead of a PECVD film eliminates the need of link spaces.

A photoresist mask is formed over link contact 31. The anti-fuse material can be etched away, except where it is covered by the photoresist mask, to form amorphous region 32, as shown in FIG. 6. The photoresist mask is removed.

In a step 219, a first metal layer is deposited over the conductive layer. The first metal layer is then etched to form a metal contact 33 within contact hole 30 and a metal contact 34 within link contact 31.

Processing for the circuit may then proceed in a conventional manner. For example after forming an insulating layer and vias in a step 220, a second metal layer is formed and etched in a step 221 and circuit pads are formed in a step 222.

Figure 7:
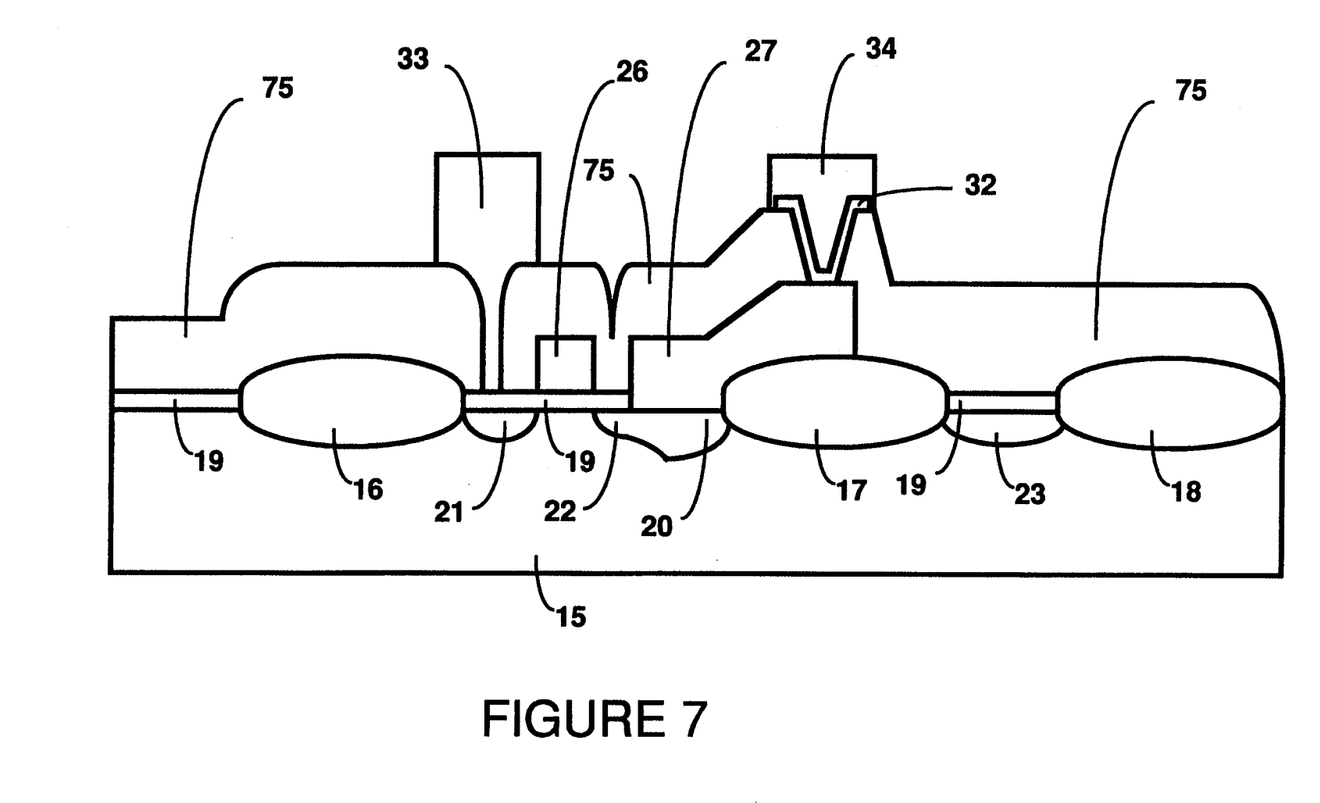
FIG. 7 shows a final structure for a PROM constructed using the method described in FIG. 1 in accordance with the preferred embodiment of the present invention.

The structure shown in FIG. 7, allows construction of a field programmable read only memory with several significant advantages over the prior art. For example, in the present invention the amorphous silicon fuse is sandwiched between a polysilicon (or metal silicide) electrode and a metal one contact. The polysilicon electrode is connected to the drain of a transistor through a buried contact. The use of an LPCVD process to deposit the amorphous silicon is a significant advantage over the prior art where PECVD is typically used to deposit the amorphous silicon. Using a LPCVD amorphous silicon film instead of a PECVD film eliminates the need of link spaces. Also, in the present invention, the prior requirement of additional layers for a second metal electrode, link oxide and link via is eliminated. In addition, in the present invention, highly oxidizing cleaning agents can be used after photolithography steps up to deposition of the amorphous silicon layer. This ensures high integrity of the amorphous silicon fuse in the unprogrammed state. The resulting cell is easily scalable and allows for the fabrication of very high density ROMs.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for fabricating a programmable read only memory cell, the method comprising the steps of:
   (a) forming an implant region within a substrate;
   (b) forming a first conductive layer over the substrate;
   (c) selectively etching the first conductive layer to form a first electrode on the substrate in physical and electrical contact with the implant region and to form a gate region for a transistor;
   (d) implanting atoms of a first conductivity type into the substrate into a first source/drain region on a first side of the gate region and into a second source/drain region on a second side of the gate region, wherein the second source/drain region is electrically coupled to the implant region;
   (e) forming an insulating layer over the first electrode, the insulating layer having a link contact which extends to the first electrode and having a contact hole extending to the first source drain region;
   (f) forming an amorphous silicon layer within the link contact and in contact with the first electrode;
   (g) depositing a metal layer; and,
   (h) etching the metal layer to form a second electrode in contact with the amorphous silicon layer and electrically separated from the first electrode by the amorphous silicon layer, and to form a metal contact to the first source/drain region through the contact hole.

2. A method as in claim 1 wherein step (b) the first conductive material comprises polysilicon.

3. A method as in claim 2 wherein in step (c) the first electrode also includes a metal-silicide formed over the polysilicon.

4. A method as in claim 1 wherein step (a) includes forming an n+ region within a substrate.

5. A method as in claim 1 wherein step (f) includes the following substeps:
   (f.1) depositing amorphous silicon using low pressure chemical vapor deposition; and,
   (f.2) selectively etching the deposited amorphous silicon.

6. A method for fabricating a fuse connected to a source/drain region of a transistor, the method comprising the steps of:
   (a) forming an implant region within a substrate;
   (b) forming a first conductive layer over the substrate;
   (c) selectively etching the first conductive layer to form a first electrode on the substrate in physical and electrical contact with the implant region and to form a gate region for the transistor;
   (d) implanting atoms of a first conductivity type into the substrate into the source/drain region on a first side of the gate region, wherein the source/drain region is electrically coupled to the implant region;
   (e) forming an insulating layer over the first electrode, the insulating layer having a link contact which extends to the first electrode;
   (f) forming an amorphous silicon layer within the link contact and in contact with the first electrode; and,
   (g) forming a second electrode in contact with the amorphous silicon layer and electrically separated from the first electrode by the amorphous silicon layer.

7. A method as in claim 6 wherein step (a) includes forming an n+ region within a substrate.

8. A method as in claim 6 wherein step (f) includes the following substeps:
   (f.1) depositing amorphous silicon using low pressure chemical vapor deposition; and,
   (f.2) selectively etching the deposited amorphous silicon.

9. A method as in claim 1 wherein in step (b) the first electrode comprises polysilicon.

10. A method as in claim 1 wherein in step (b) the first electrode comprises a metal-silicide.

* * * * *